(12) United States Patent
Liu et al.

(10) Patent No.: US 9,618,405 B2
(45) Date of Patent: Apr. 11, 2017

(54) PIEZOELECTRIC ACOUSTIC RESONATOR BASED SENSOR

(71) Applicant: INVENSENSE, INC., San Jose, CA (US)

(72) Inventors: Fang Liu, San Jose, CA (US); Julius Ming-Lin Tsai, San Jose, CA (US); Xiang Li, Mountian View, CA (US); Mike Daneman, Campbell, CA (US)

(73) Assignee: INVENSENSE, INC., San Jose, CA (US)

( * ) Notice: Subject to any disclaimer, the term of this patent is extended or adjusted under 35 U.S.C. 154(b) by 314 days.

(21) Appl. No.: 14/453,326

(22) Filed: Aug. 6, 2014

(65) Prior Publication Data

US 2016/0041047 A1 Feb. 11, 2016

(51) Int. Cl.
*G06F 3/043* (2006.01)
*H03K 17/96* (2006.01)
*G01L 1/16* (2006.01)

(52) U.S. Cl.
CPC ............ *G01L 1/165* (2013.01); *G06F 3/0436* (2013.01); *H03K 17/96* (2013.01); *H03K 17/9643* (2013.01); *H03K 2217/96003* (2013.01)

(58) Field of Classification Search
CPC ..... G01L 1/165; G06F 3/043; H03K 17/9643; H03K 17/96; H03K 2217/96003

(Continued)

(56) References Cited

U.S. PATENT DOCUMENTS 3,748,502 A 7/1973 Bernstein
4,556,871 A * 12/1985 Yoshikawa ........ H03K 17/9618
341/26

(Continued)

FOREIGN PATENT DOCUMENTS

CN 184872 A 10/2006
CN 1975956 A 6/2007
(Continued)

OTHER PUBLICATIONS

Wygant, et al., "Integration of 2D CMUT Arrays with Front-End Electronics for Volumetric Ultrasound Imaging," IEEE Transactions on Ultrasonics, Ferroelectrics, And Frequency Control, Feb. 2008, 16 pages, vol. 55 No. 2.

(Continued)

*Primary Examiner* — J M Saint Surin
(74) *Attorney, Agent, or Firm* — Amin, Turocy & Watson, LLP (57) ABSTRACT

A piezoelectric acoustic resonator based sensor is presented herein. A device can include an array of piezoelectric transducers and an array of cavities that has been attached to the array of piezoelectric transducers to form an array of resonators. A resonator of the array of resonators can be associated with a first frequency response corresponding to a first determination that the resonator has been touched, and a second frequency response corresponding to a second determination that the resonator has not been touched. The array of piezoelectric transducers can include a piezoelectric material; a first set of electrodes that has been formed a first side of the piezoelectric material; and a second set of electrodes that has been formed on second side of the piezoelectric material.

25 Claims, 12 Drawing Sheets

(58) Field of Classification Search
USPC .......................................................... 73/579
See application file for complete search history.

(56) References Cited

U.S. PATENT DOCUMENTS

| | | | |
|---|---|---|---|
| 5,386,479 A * | 1/1995 | Hersh | H04R 17/00 |
| | | | 381/182 |
| 5,963,679 A | 10/1999 | Setlak | |
| 7,013,031 B2 | 3/2006 | Kim et al. | |
| 7,053,529 B2 | 5/2006 | Knowles | |
| 7,067,962 B2 | 6/2006 | Scott | |
| 7,109,642 B2 | 9/2006 | Scott | |
| 7,400,750 B2 | 7/2008 | Nam | |
| 7,459,836 B2 | 12/2008 | Scott | |
| 7,489,066 B2 | 2/2009 | Scott et al. | |
| 7,739,912 B2 | 6/2010 | Schneider et al. | |
| 8,139,827 B2 | 3/2012 | Schneider et al. | |
| 8,335,356 B2 | 12/2012 | Schmitt | |
| 8,433,110 B2 | 4/2013 | Kropp et al. | |
| 8,508,103 B2 | 8/2013 | Schmitt et al. | |
| 8,515,135 B2 | 8/2013 | Clarke et al. | |
| 8,666,126 B2 | 3/2014 | Lee et al. | |
| 8,703,040 B2 | 4/2014 | Liufu et al. | |
| 8,723,399 B2 | 5/2014 | Sammoura et al. | |
| 8,805,031 B2 | 8/2014 | Schmitt | |
| 8,913,039 B2 * | 12/2014 | Nikolovski | G06F 3/0416 |
| | | | 178/18.04 |
| 9,007,348 B2 * | 4/2015 | Nikolovski | G06F 3/0436 |
| | | | 345/173 |
| 9,056,082 B2 | 6/2015 | Liautaud et al. | |
| 9,114,977 B2 | 8/2015 | Daneman et al. | |
| 9,182,853 B2 * | 11/2015 | Wennemer | G06F 3/0433 |
| 9,342,187 B2 * | 5/2016 | Jakobsen | G06F 3/0421 |
| 2004/0094815 A1 | 5/2004 | Park et al. | |
| 2005/0146401 A1 | 7/2005 | Tilmans et al. | |
| 2006/0012583 A1 | 1/2006 | Knowles et al. | |
| 2007/0096605 A1 | 5/2007 | Fujii et al. | |
| 2007/0230754 A1 | 10/2007 | Jain et al. | |
| 2008/0198145 A1 | 8/2008 | Knowles et al. | |
| 2009/0274343 A1 | 11/2009 | Clarke | |
| 2010/0239751 A1 | 9/2010 | Regniere | |
| 2010/0251824 A1 | 10/2010 | Schneider et al. | |
| 2010/0256498 A1 | 10/2010 | Tanaka | |
| 2011/0210554 A1 | 9/2011 | Boysel | |
| 2011/0285244 A1 | 11/2011 | Lewis et al. | |
| 2012/0016604 A1 | 1/2012 | Irving et al. | |
| 2012/0092026 A1 | 4/2012 | Liautaud et al. | |
| 2012/0147698 A1 | 6/2012 | Wong et al. | |
| 2012/0167823 A1 | 7/2012 | Gardner et al. | |
| 2012/0279865 A1 | 11/2012 | Regniere et al. | |
| 2012/0288641 A1 | 11/2012 | Diatezua et al. | |
| 2012/0319220 A1 | 12/2012 | Noda et al. | |
| 2013/0032906 A1 | 2/2013 | Ogawa et al. | |
| 2013/0127592 A1 | 5/2013 | Fyke et al. | |
| 2013/0133428 A1 | 5/2013 | Lee et al. | |
| 2013/0201134 A1 | 8/2013 | Schneider et al. | |
| 2013/0210175 A1 | 8/2013 | Hoisington et al. | |
| 2014/0145244 A1 | 5/2014 | Daneman et al. | |
| 2014/0176332 A1 | 6/2014 | Alameh et al. | |
| 2014/0219521 A1 | 8/2014 | Schmitt et al. | |
| 2014/0355387 A1 | 12/2014 | Kitchens, II et al. | |
| 2015/0035375 A1 * | 2/2015 | Mayer | B60T 17/22 |
| | | | 307/104 |
| 2015/0036065 A1 | 2/2015 | Yousefpor et al. | |
| 2015/0076963 A1 * | 3/2015 | Sipp | H01L 41/042 |
| | | | 310/316.01 |
| 2015/0169136 A1 | 6/2015 | Ganti et al. | |
| 2015/0189136 A1 | 7/2015 | Chung et al. | |
| 2015/0220767 A1 | 8/2015 | Yoon et al. | |
| 2015/0261261 A1 | 9/2015 | Bhagavatula et al. | |
| 2015/0286312 A1 | 10/2015 | Kang et al. | |
| 2015/0298965 A1 | 10/2015 | Tsai et al. | |
| 2016/0031702 A1 | 2/2016 | Daneman et al. | |

FOREIGN PATENT DOCUMENTS

| | | |
|---|---|---|
| CN | 102590555 A | 7/2012 |
| CN | 103026520 A | 4/2013 |
| EP | 1533743 A1 | 5/2005 |
| KR | 20090010357 A | 1/2009 |
| WO | 2009137106 A2 | 11/2009 |
| WO | 2015009635 A1 | 1/2015 |
| WO | 2015112453 A1 | 7/2015 |
| WO | 2015120132 A1 | 8/2015 |
| WO | 2015131083 A1 | 9/2015 |

OTHER PUBLICATIONS

Fesenko, "Capacitive Micromachined Ultrasonic Transducer (cMUT) for Biometric Applications," Thesis for the Degree of Erasmus Mundus Master of Nanoscience and Nanotechnology, 2012, 46 pages, Goteborg, Sweden.
Vanagas, et al., "Study of the CMUT Operation in Microfluidic Application," Paper ID: 344—2012 IEEE International Ultrasonics Symposium. Last accessed Jun. 26, 2014, 4 pages.
Feng, et al., "Touch Panel with Integrated Fingerprint Sensors Based User Identity Management," Last accessed Jul. 20, 2014, 7 pages.
Singh, "Fingerprint Sensing Techniques, Devices and Applications," Apr. 2003, 31 pages.
"Capacitive Micromachined Ultrasonic Transducers," Wikipedia, Last accessed Jun. 25, 2014, 4 pages.
"CMUT Working Principle". Last accessed Jun. 26, 2014, 2 pages.
Schmitt, et al., "Surface Acoustic Impediography: A New Technology for Fingerprint Mapping and Biometric Identification: A Numerical Study," Proc. SPIE 5403, Sensors, and Command, Control, Communications, and Intelligence (C3I) Technologies for Homeland Security and Homeland Defense III, 309, Sep. 15, 2004, 2 pages.
"General Description and Advantages of CMUTs". Last accessed Jun. 26, 2014, 5 pages.
International Search Report and Written Opinion dated Nov. 2, 2015 for PCT Application Serial No. PCT/US2015/043329, 12 pages.
Taiwanese Office Action dated Dec. 8, 2015 for Taiwanese Patent Application Serial No. 103132242, 6 pages.
Partial International Search Report dated Jan. 4, 2016 for PCT Application Serial No. PCT/US2015/048964, 7 pages.
Savoia et al. "Design and Fabrication of a cMUT Probe for Ultrasound Imaging of Fingerprints" 2010 IEEE International Ultrasonics Symposium Proceedings; Publication [online] Oct. 2010 [retrieved Oct. 7, 2014] Retrieved from Internet: <http://ieeexplore.ieee.org/xpl/login.jsp?tp=&arnumber=5935836>; pp. 1877-1880.
Dausch et al. "Theory and Operation of 2-D Array Piezoelectric Micromachined Ultrasound Transducers" IEEE Transactions on Ultrasonics, Ferroelectrics, and Frequency Control, vol. 55, No. 11, Nov. 2008; Retrieved from Internet on [Dec. 9, 2014]: <https:llrti.org/pubs/dauschtuffcv55is11 p2484nov2008.pdf >.
Qiu et al. "Piezoelectric Micromachined Ultrasound Transducer (PMUT) Arrays for Integrated Sensing, Actuation and Imaging"; Sensors 2015, 15, 8020-8041; doi: 1 0.3390/S150408020; Retrieved from Internet [Dec. 9, 2015] : <http://www.mdpi.com/1424-8220/15/4/8020/pdf>.
Chinese Office Action dated Feb. 3, 2016 for Chinese Application Serial No. 201410483646.X, 12 pages.
International Search Report and Written Opinion dated Mar. 14, 2016 for PCT Application Serial No. PCT/US2015/048964, 16 pages.
Office Action dated Apr. 14, 2016 for US. Appl. No. 14/480,051, 29 pages.
Office Action dated Jan. 30, 2014 for U.S. Appl. No. 13/687,304, 15 pages.
Office Action dated May 28, 2014 for U.S. Appl. No. 13/687,304, 13 pages.
Office Action dated Sep. 16, 2014 for U.S. Appl. No. 13/687,304, 11 pages.
Office Action dated Oct. 20, 2015 for U.S. Appl. No. 14/480,051, 25 pages.

(56) References Cited

OTHER PUBLICATIONS

Khuri-Yakub, et al. "Next-gen ultrasound ," IEEE Spectrum, vol. 46, No. 5, pp. 44-54, May 2009.
Lamberti, et al. "A high frequency cMUT probe for ultrasound imaging of fingerprints," Sensors and Actuators A: Physical 172 (2), pp. 561-569. 2011.
Iula, et al. "Capacitive Microfabricated Ultrasonic Transducers for Biometric Applications"; Microelectronic Engineering, vol. 88, Issue 8, 2011, pp. 2278-2280.
Tang, et al. "Pulse-Echo Ultrasonic Fingerprint Sensor on A Chip," University of California, Berkeley, CA, USA, 2013.
Lu, et al. "High frequency piezoelectric micromachined ultrasonic transducer array for intravascular ultrasound Imaging." Micro Electro Mechanical Systems (MEMS), 2014 IEEE 27th International Conference on. IEEE, 2014.
Olsson, III, et al. "Post-CMOS-Compatible Aluminum Nitride Resonant MEMS Accelerometers." Journal of Microelectromechanical Systems, vol. 18, No. 3, Jun. 2009.
Wojciechowski, et al. "Single-chip precision oscillators based on multi-frequency, high-Q aluminum nitride MEMS-resonators." Solid-State Sensors, Actuators and Microsystems Conference, 2009. Transducers 2009. International. IEEE, 2009.
Office Action dated Sep. 28, 2016 for US. Appl. No. 14/829,404, 50 pages.
Chinese Office Action dated Aug. 1, 2016 for Chinese Application Serial No. 201410483646.X, 4 pages.
Office Action dated Jan. 9, 2016 for U.S. Appl. No. 14/800,604, 9 pages.
Final Office Action dated Jul. 6, 2016 for U.S. Appl. No. 14/800,604, 10 pages.

\* cited by examiner

PIEZOELECTRIC ACOUSTIC RESONATOR BASED SENSOR

TECHNICAL FIELD

This disclosure generally relates to embodiments for a piezoelectric acoustic resonator based sensor.

BACKGROUND

Conventional fingerprint sensor technologies detect fingerprints using optical, ultrasonic, thermal, and/or radio frequency (RF) means. However, conventional fingerprint sensor technologies have had some drawbacks, some of which may be noted with reference to the various embodiments described herein.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

There are two kinds of finger print sensors, namely swipe-based and area-based. For mobile applications, optical method is too bulky and expensive; thermal and swipe-based RF method are not the favored due to user experience; area-based ultrasound and RF sensors have challenges to lower the manufacturing cost. In general, above conventional fingerprint sensor technologies are subject to errors due to finger contamination, sensor contamination, imaging errors, etc. Various embodiments disclosed herein provide for improved fingerprint sensor performance by measuring a frequency response of a piezoelectric acoustic resonator.

For example, a device can include an array of piezoelectric transducers, and an array of cavities that has been attached to the array of piezoelectric transducers to form an array of resonators, e.g., an array of MEMS piezoelectric acoustic resonators. A resonator, e.g., a membrane resonator, a Helmholtz resonator, etc. of the array of resonators can be associated with a first frequency response, e.g., a resonant frequency of the resonator, a Q factor of the resonator, etc. corresponding to a determination that the resonator has a non-touch baseline condition. Then a second frequency response, e.g., increase in resonant frequency of the resonator, decrease in Q factor of the resonator, etc. corresponding to a determination that the resonator has been touched, e.g., by the finger ridge. Thus the finger print map can be determined according to the frequency response changes of resonators in the resonator array.

In an embodiment, the array of piezoelectric transducers can include a piezoelectric material; a first set of electrodes that has been formed a first side of the piezoelectric material; and a second set of electrodes that has been formed on second side of the piezoelectric material—a piezoelectric transducer of the array of piezoelectric transducers corresponding to the resonator including a first electrode of the first set of electrodes and a second electrode of the second set of electrodes.

In another embodiment, the piezoelectric transducer comprises a portion of the resonator, e.g., a membrane resonator, that has been touched. In yet another embodiment, a first end of a cavity of array of cavities corresponding to a portion of the resonator, e.g., a Helmholtz resonator, that has been touched is smaller than a second end of the cavity. In an embodiment, the first end of the cavity is open to the environment, e.g., air adjacent to the device, etc. In another embodiment, the cavity has been filled with a first material corresponding to a first acoustic velocity that is different from a second acoustic velocity corresponding to a second material that is adjacent to, surrounding, etc. the cavity.

Another embodiment can include a system, e.g., a piezoelectric acoustic resonator based fingerprint sensor, etc. that can include an array of piezoelectric transducers; an array of cavities that has been attached to the array of piezoelectric transducers to form an array of resonators; a memory to store instructions; and a processor coupled to the memory, that facilitates execution of the instructions to perform operations, comprising: determining a frequency response of a resonator of the array of resonators—the resonator including a piezoelectric transducer of the array of piezoelectric transducers and a cavity of the array of cavities; and determining that the resonator has been touched, e.g., by a finger, etc. in response determining that a change in the frequency response satisfies a defined condition, e.g., a resonant frequency of the resonator has increased, a Q factor of the resonator has decreased, etc.

In one embodiment, a first portion of the cavity, e.g., corresponding to a portion of the resonator that has been touched, is smaller than a second portion of the cavity. In another embodiment, the first portion of the cavity is open to the environment. In yet another embodiment, the cavity has been filled with a first material corresponding to a first acoustic velocity that is different from a second acoustic velocity corresponding to a second material that is adjacent to the cavity.

One embodiment can include a method including forming an array of piezoelectric transducers on a first substrate; forming one or more portions of an array of cavities using a second substrate; and attaching the array of piezoelectric transducers to the second substrate to form an array of resonators. A resonator, e.g., a membrane resonator, a Helmholtz resonator, etc. of the array of resonators can be associated with a first frequency response with respect to, e.g., a resonant frequency of the resonator, a Q factor of the resonator, etc. corresponding to a determined non-touch of the resonator. Further, the resonator can be associated with a second frequency response with respect to, e.g., the resonant frequency, the Q factor, etc. corresponding to a determined touch of the resonator. Furthermore, the method can include removing the first substrate from the array of piezoelectric transducers.

In an embodiment, the forming of the array of piezoelectric transducers can include forming a first set of electrodes on a first side of a piezoelectric material, and forming a second set of electrodes on a second side of the piezoelectric material—a piezoelectric transducer of the array of piezoelectric transducers corresponding to the resonator can include a first electrode of the first set of electrodes and a second electrode of the second set of electrodes.

In another embodiment, the method can include filling a cavity of the array of cavities corresponding to the resonator, e.g., the Helmholtz resonator, with a material having a first acoustic velocity that is different from a second acoustic velocity of the second substrate.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art.

Figure 1:
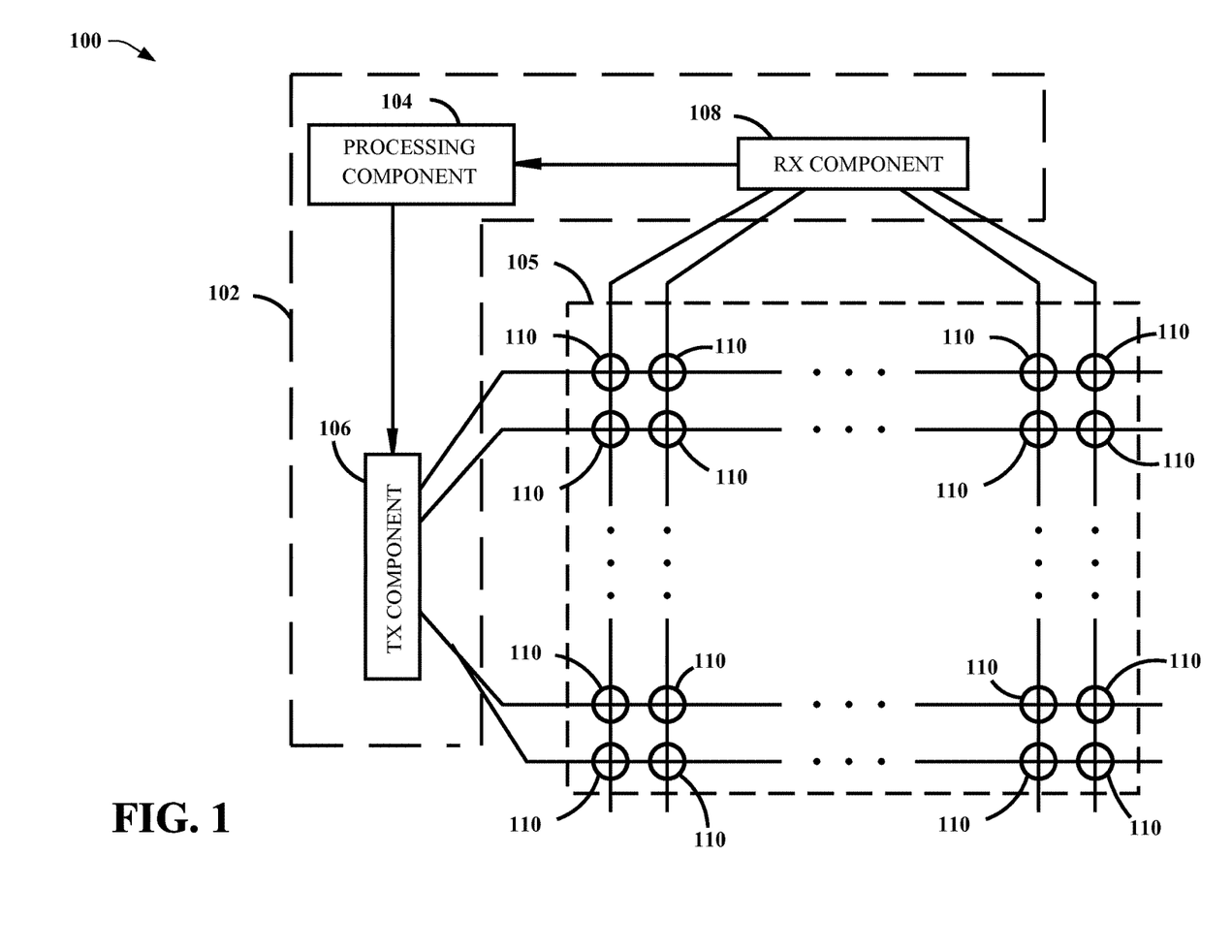
FIG. 1 illustrates a block diagram of a piezoelectric acoustic resonator based sensor, in accordance with various embodiments.

Referring now to FIG. 1, a block diagram of a piezoelectric acoustic resonator based sensor 100 is illustrated, in accordance with various embodiments. Piezoelectric acoustic resonator based sensor 100 includes control component 102 and array of piezoelectric acoustic resonators 105. Control component 102, e.g., a system, an application specific integrated circuit (ASIC), etc. can include computing device(s), memory device(s), computing system(s), logic, etc. for generating stimuli, e.g., via TX component 106, detecting a response to the stimuli, e.g., via RX component 108, and determining, e.g., via processing component 104 based on the stimuli and the response to the stimuli, a frequency response, e.g., a change in a resonant frequency, a change in a Q factor, etc. of a piezoelectric acoustic resonator (110, 205 (see below), 605 (see below), etc.) of array of piezoelectric acoustic resonators 105. In this regard, processing component 104 can determine, based on the frequency response, whether the piezoelectric acoustic resonator has been touched, e.g., by a ridge of a finger, and further derive a fingerprint based on determining which piezoelectric acoustic resonator(s) 110 of array of piezoelectric acoustic resonators 105 have been touched.

Figure 2:
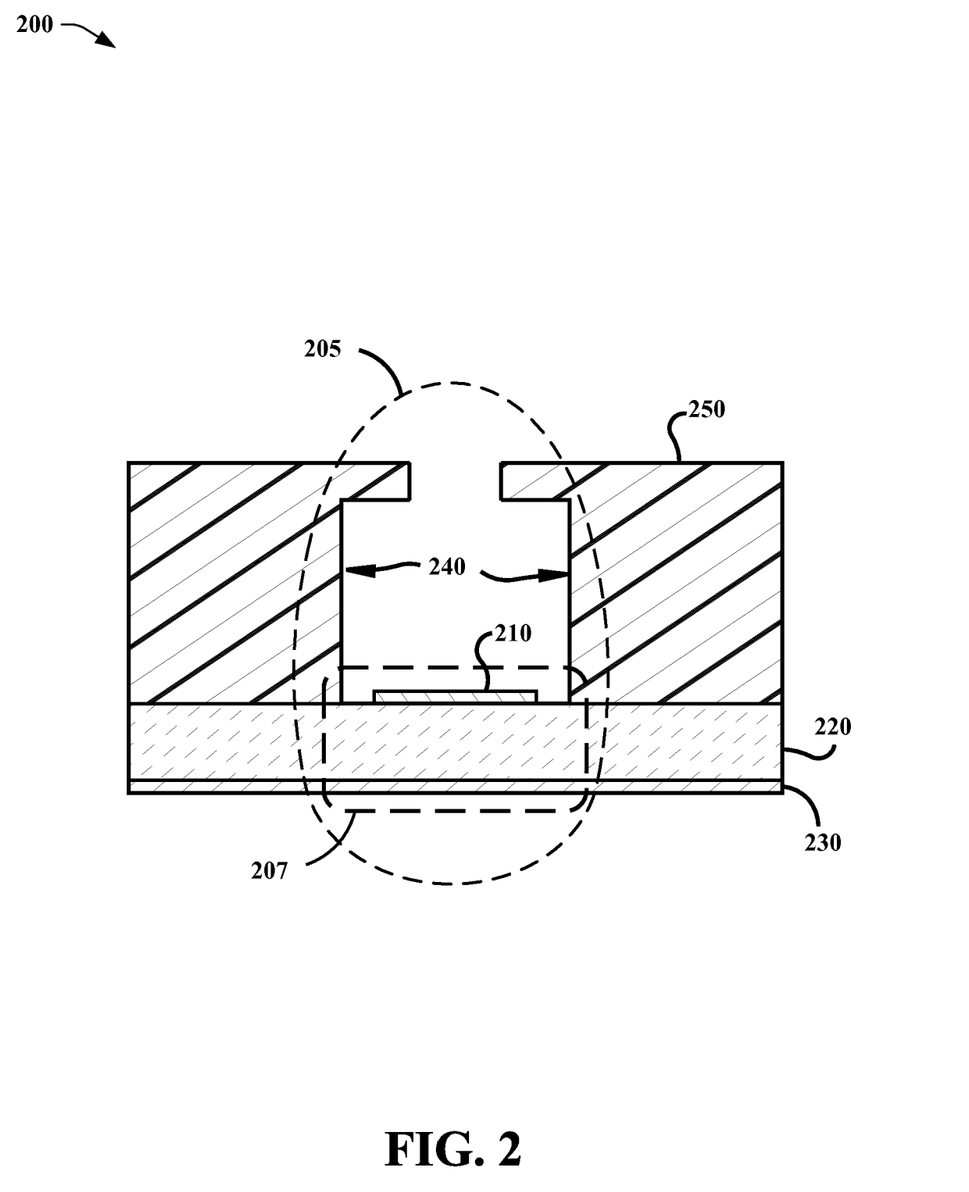
FIG. 2 illustrates a block diagram of a cross section of a microelectromechanical systems (MEMS) piezoelectric acoustic resonator, in accordance with various embodiments.

FIG. 2 illustrates a block diagram of a cross section of MEMS piezoelectric acoustic resonator 205, in accordance with various embodiments. MEMS piezoelectric acoustic resonator 205, e.g., a Helmholtz resonator, includes cavity 240 that has been formed by, within, etc. substrate 250, e.g., a silicon based material, etc. In the embodiment illustrated by FIG. 2, cavity 240 includes an opening that is exposed to the environment, e.g., air. Further, a cross section of a first end, or top portion, of cavity 240 is smaller than a cross section of a second end, or bottom portion, of cavity 240, e.g., enabling cavity 240 to experience a resonant frequency ($f_H$), or Helmholtz resonance, e.g., as defined by Equation (1) below:

$$f_H = \frac{v}{2\pi}\sqrt{\frac{A}{V_0 L_{eq}}}, \qquad (1)$$

where A is the cross-sectional area of the top portion, or "neck", of cavity 240, $V_0$ is the static volume of cavity 240, $L_{eq}$ is the equivalent length of the neck with end correction, and v is the speed of sound in a gas as given by Equation (2) below:

$$v = 331.3 + 0.606 \cdot \theta \qquad (2)$$

where is the ambient temperature in degree Celsius.

Figure 3:
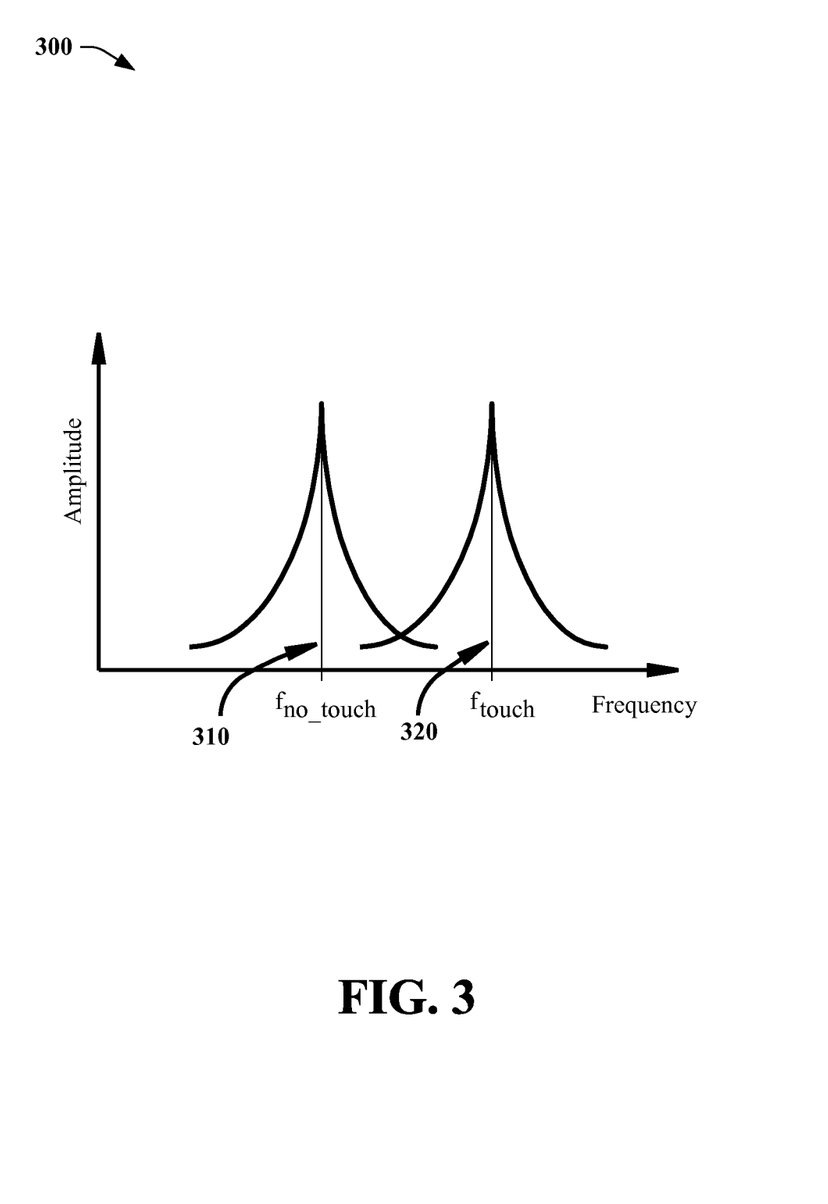
FIG. 3 illustrates a frequency response of a MEMS piezoelectric acoustic resonator, in accordance with various embodiments.

MEMS piezoelectric acoustic resonator 205 includes piezoelectric transducer 207, which includes top electrode 210, piezoelectric material 220, e.g., piezoelectric membrane, polyvinylidene fluoride (PVDF), etc. and bottom electrode 230. In one embodiment, top electrode 210 and bottom electrode 230 can be manufactured from a conductive material, e.g., metal, and control component 102 can generate and apply a stimulus, e.g., a pulse signal, a frequency sweep, an alternating current (AC) voltage, an AC current, etc. to piezoelectric transducer 207 via top electrode 210 and bottom electrode 230. As illustrated by FIG. 3, control component 102 can measure, e.g., utilizing a network analyzer, etc. based on the stimulus, e.g., based on a Fourier transform analysis, resonant frequency 310, e.g., corresponding to a non-touch of piezoelectric acoustic resonator 205, and resonant frequency 320, e.g., corresponding to a touch of piezoelectric acoustic resonator 205. In this regard, in response to determining that the resonant frequency of piezoelectric acoustic resonator 205 has increased, e.g., to resonant frequency 320, control component 102 can determine that MEMS piezoelectric acoustic resonator 205 has been touched, e.g., by a ridge of a finger.

Figure 4:
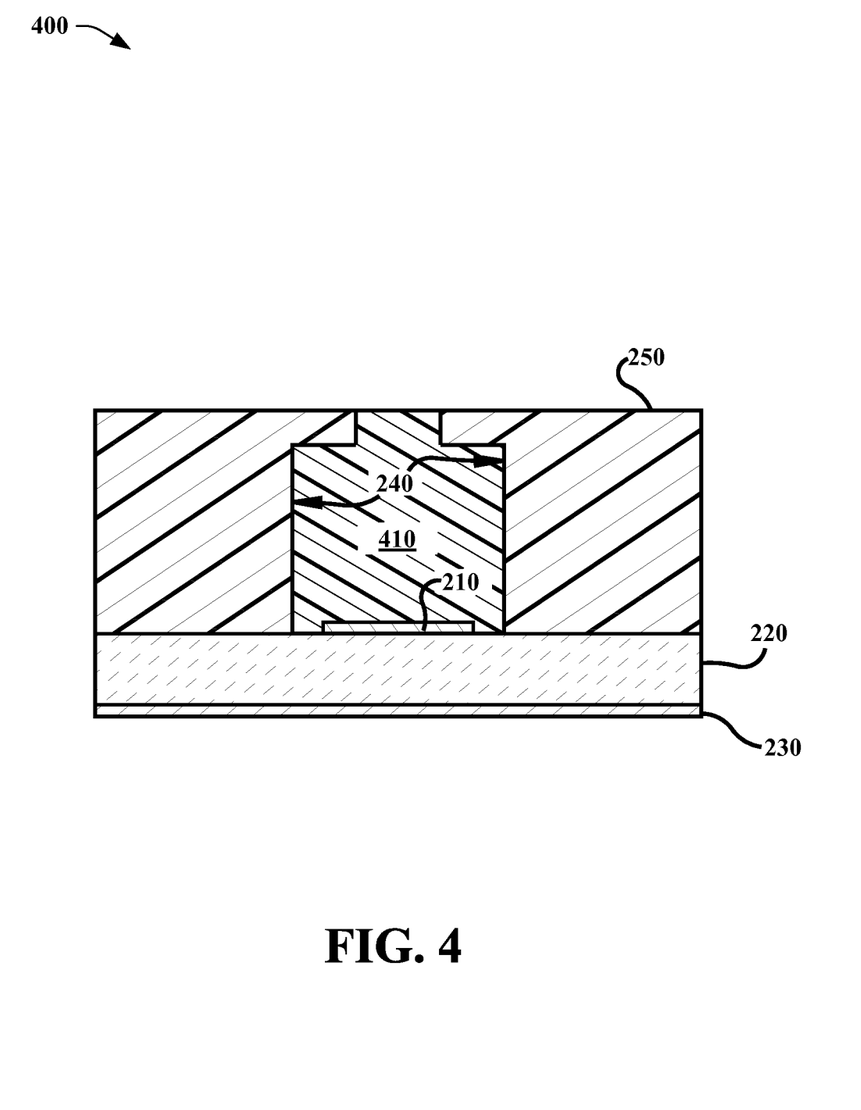
FIG. 4 illustrates a block diagram of a cross section a MEMS piezoelectric acoustic resonator including a material, in accordance with various embodiments.

FIG. 4 illustrates a block diagram of a cross section a MEMS piezoelectric acoustic resonator including material 410, in accordance with various embodiments. As illustrated by FIG. 4, cavity 240 can be filled with material 410, e.g., rubber, gel, etc. that is associated with a first acoustic velocity that is different from a second acoustic velocity corresponding to substrate 250. In this regard, a resonant frequency of MEMS piezoelectric acoustic resonator 205 can be modified in a predetermined manner by selecting material 410 of a predetermined acoustic velocity with respect to an acoustic velocity of substrate 250. Further, including material 410 in cavity 240 can prevent debris, contaminants, etc. from entering cavity 240 and subsequently introducing errors in measurements of the resonant frequency of MEMS piezoelectric acoustic resonator 205.

Figure 5:
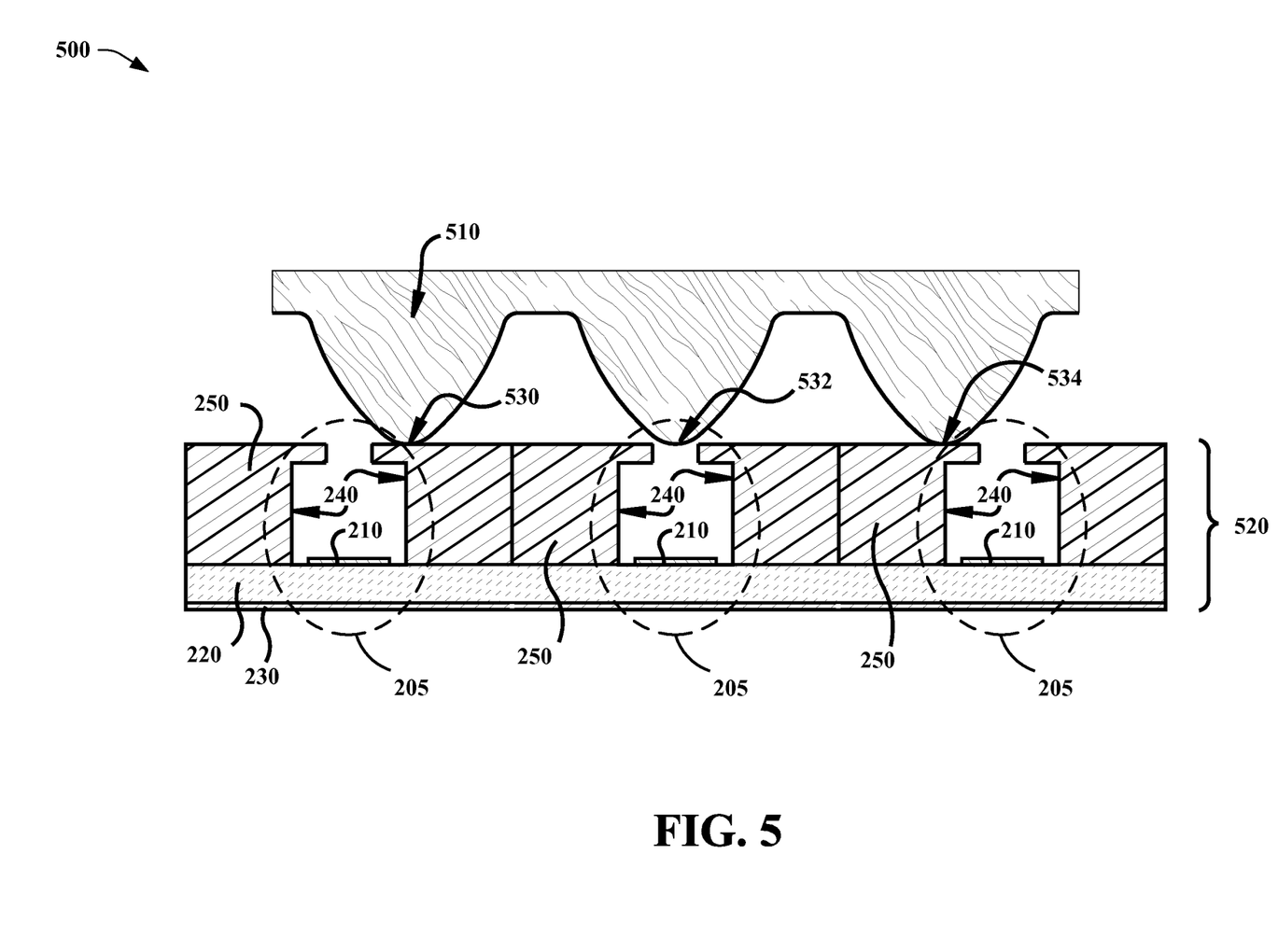
FIG. 5 illustrates a block diagram of a cross section of a portion of an array of MEMS piezoelectric acoustic resonators being contacted by a finger, in accordance with various embodiments.

FIG. 5 illustrates a block diagram of a cross section of a portion of an array (520) of MEMS piezoelectric acoustic resonators (205) being contacted by finger 510, in accordance with various embodiments. Control component 102 can determine that finger ridge 532 has touched a MEMS piezoelectric acoustic resonator (205) of the portion of the array based on a determination that a resonant frequency of the MEMS piezoelectric acoustic resonator has increased. Further, control component 102 can determine that other MEMS piezoelectric acoustic resonators (205) of the portion of the array have not been touched, e.g., by finger ridge 530 and finger ridge 534, based on respective determinations that resonant frequencies of the other MEMS piezoelectric acoustic resonators has not changed. In this regard, control component 102 can derive, based on such determinations, a fingerprint corresponding to finger 510.

Figure 6:
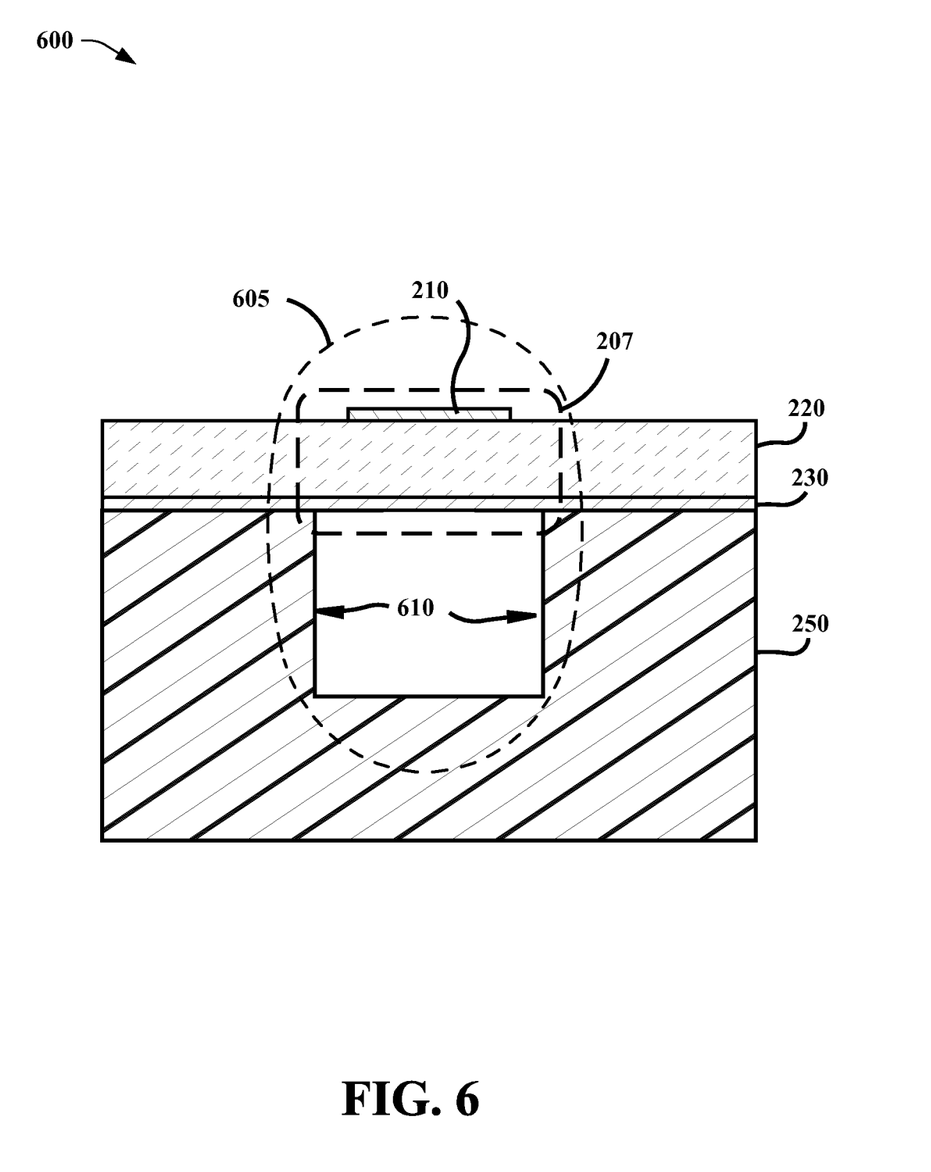
FIG. 6 illustrates a block diagram of a cross section of another MEMS piezoelectric acoustic resonator, in accordance with various embodiments.

Now referring to FIG. 6, a block diagram of a cross section of MEMS piezoelectric acoustic resonator 605 is illustrated, in accordance with various embodiments. MEMS piezoelectric acoustic resonator 605, e.g., a membrane resonator, includes cavity 610 that has been formed by, within, etc. substrate 250, e.g., a silicon based material, and has been enclosed by bottom electrode 230 of piezoelectric transducer 207. Control component 102 can generate and apply a stimulus, e.g., a pulse signal, a frequency sweep, an alternating AC voltage, an AC current, etc. to piezoelectric transducer 207 via top electrode 210 and bottom electrode 230.

Figure 7:
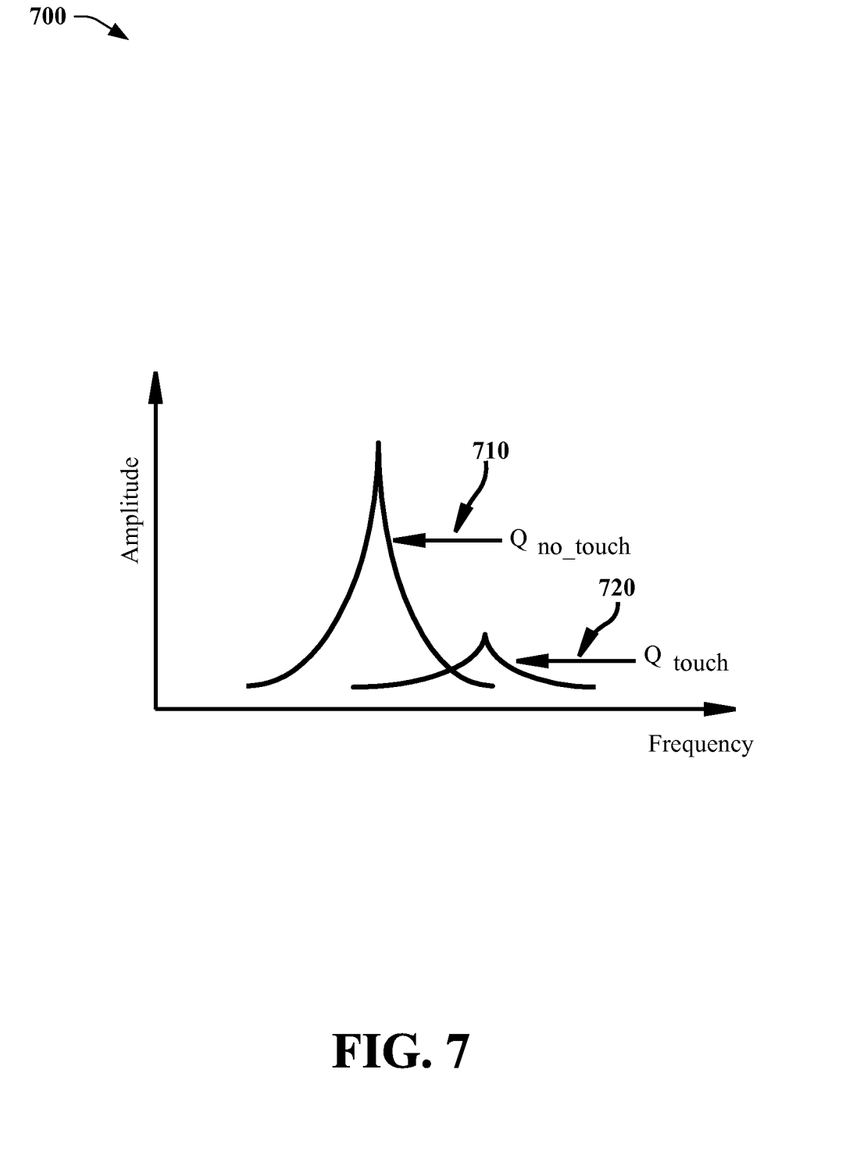
FIG. 7 illustrates a frequency response of another MEMS piezoelectric acoustic resonator, in accordance with various embodiments.

As illustrated by FIG. 7, control component 102 can measure, based on the stimulus, Q factor 710, e.g., corresponding to a non-touch of piezoelectric acoustic resonator 605, and Q factor 720, e.g., corresponding to a touch of piezoelectric acoustic resonator 605. In this regard, in response to determining that the Q factor of piezoelectric acoustic resonator 605 has decreased, e.g., to Q factor 720, control component 102 can determine that MEMS piezoelectric acoustic resonator 605 has been touched, e.g., by a ridge of a finger.

Figure 8:
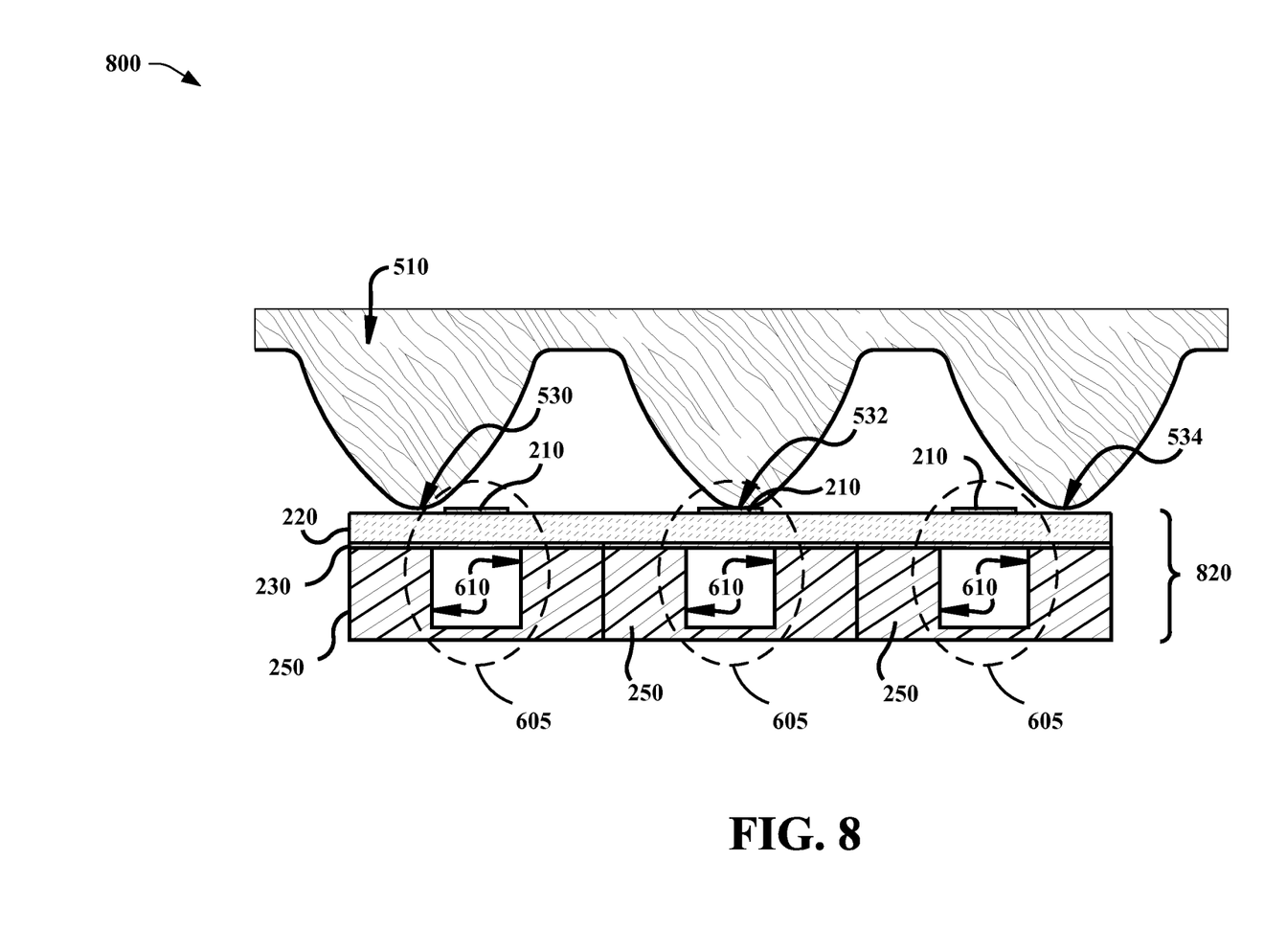
FIG. 8 illustrates a block diagram of a cross section of a portion of another array of MEMS piezoelectric acoustic resonators being contacted by a finger, in accordance with various embodiments.

FIG. 8 illustrates a block diagram of a cross section of a portion of an array (820) of MEMS piezoelectric acoustic resonators (605) being contacted by finger 510, in accordance with various embodiments. Control component 102 can determine that finger ridge 532 has touched a MEMS piezoelectric acoustic resonator (605) of the portion of the array based on a determination that a Q factor of the MEMS piezoelectric acoustic resonator has decreased. Further, control component 102 can determine that other MEMS piezoelectric acoustic resonators (605) of the portion of the array have not been touched, e.g., by finger ridge 530 and finger ridge 534, based on respective determinations that Q factors of the other MEMS piezoelectric acoustic resonators have not changed. In this regard, control component 102 can derive, based on such determinations, a fingerprint corresponding to finger 510.

Figure 9:
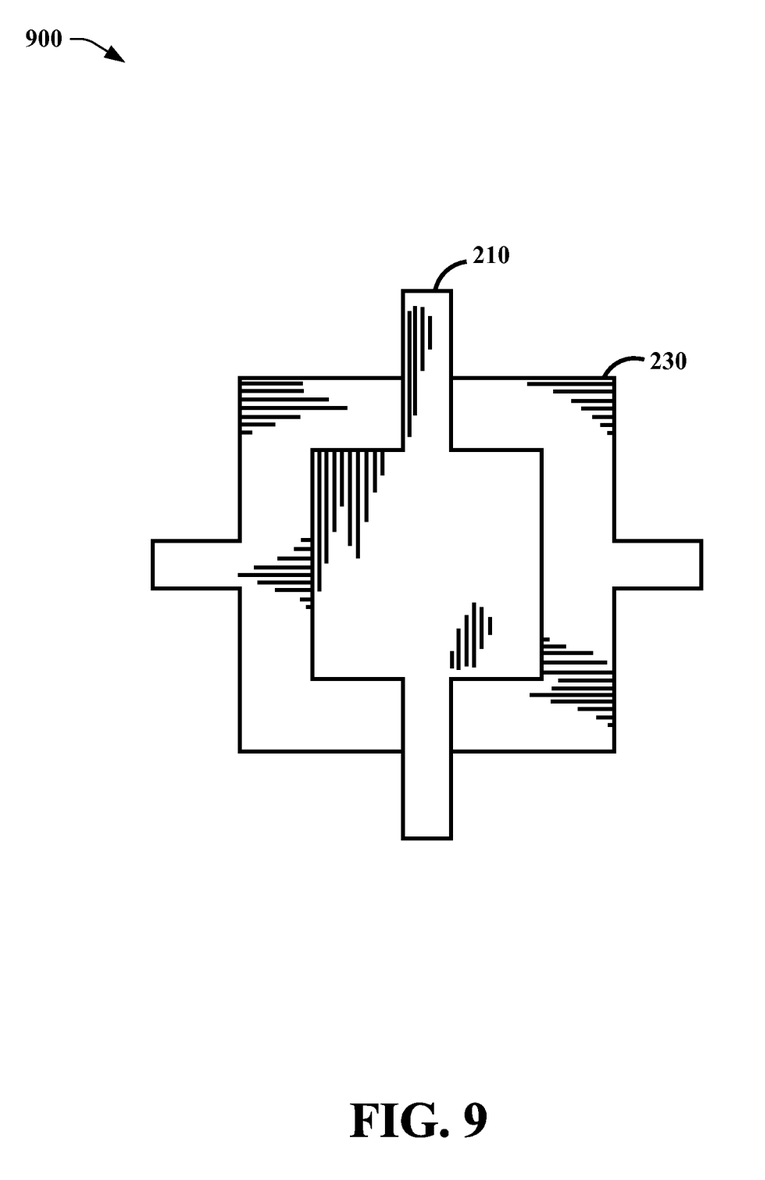
FIG. 9 illustrates a block diagram of a top view of electrodes of a piezoelectric acoustic resonator, in accordance with various embodiments.
Figure 10:
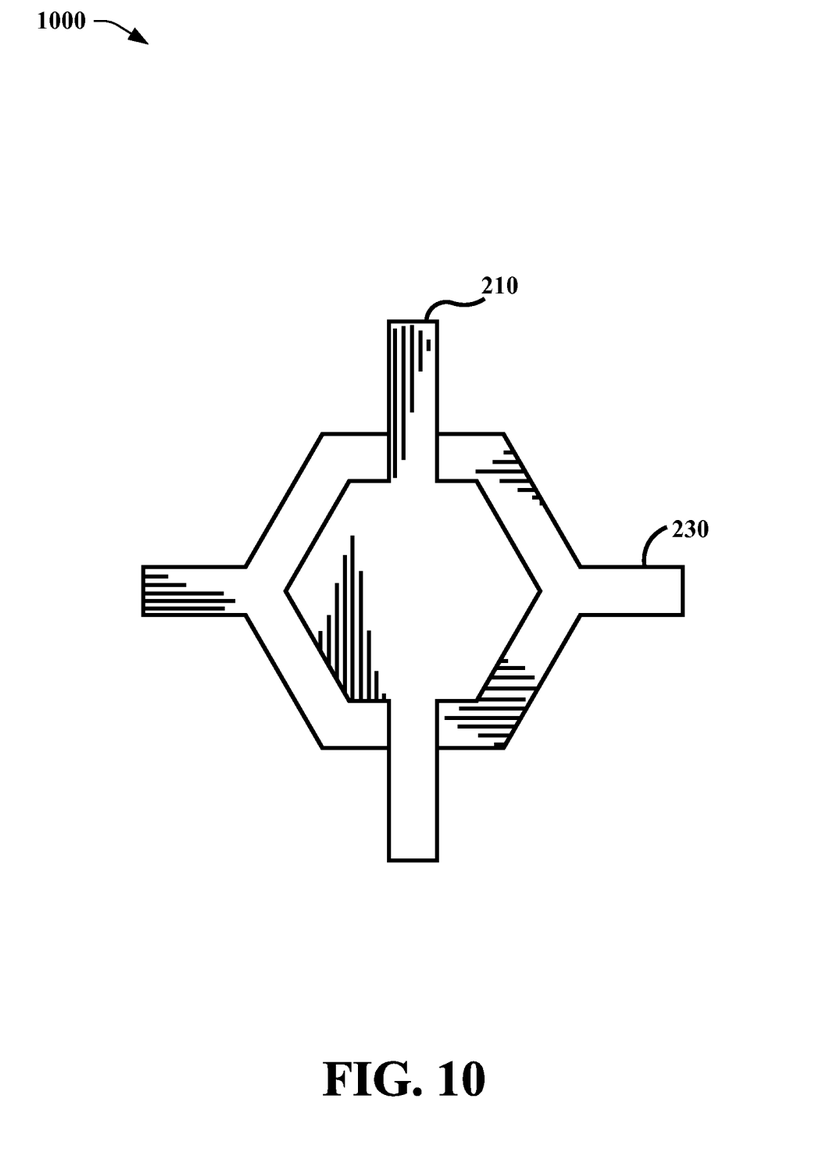
FIG. 10 illustrates a block diagram of a top view of other electrodes of a piezoelectric acoustic resonator, in accordance with various embodiments.

In an embodiment illustrated by FIG. 9, top electrode 210 can form a square shape that can be smaller, and located above, a square shape of bottom electrode 230. In yet another embodiment illustrated by FIG. 10, top electrode 210 can form a shape of a regular polygon that can be smaller, and located above, a regular polygon shape of bottom electrode 230. In this regard, it should be appreciated by a person of ordinary skill in MEMS technologies having the benefit of the instant disclosure that embodiments of devices disclosed herein can comprise electrodes of various shapes.

Figure 11:
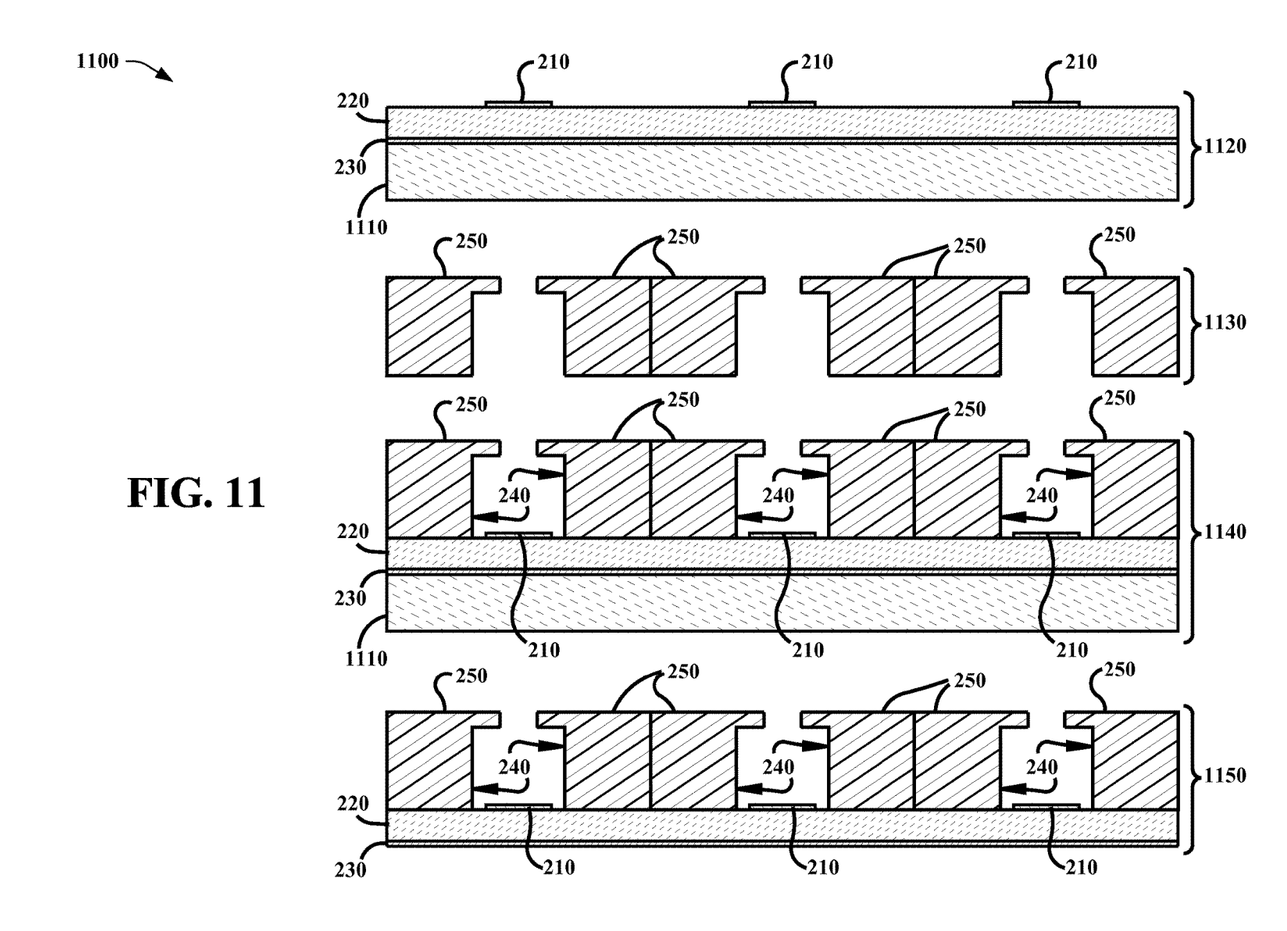
FIG. 11 illustrates a block diagram of a method for assembling a MEMS piezoelectric acoustic resonator, in accordance with various embodiments.

Referring now to FIG. 11, a block diagram (1100) representing a method for manufacturing, assembling, etc. a MEMS piezoelectric acoustic resonator, e.g., MEMS piezoelectric acoustic resonator 205, is illustrated, in accordance with various embodiments. At 1120, an array of piezoelectric transducers (207) can be formed on substrate 1110. For example, bottom electrodes (230) can be formed on substrate 1110; dielectric material 220 can be formed on, placed on, etc. the bottom electrodes; and top electrodes (210) can be formed on, placed on, etc. dielectric material 220.

At 1130, portions(s) of an array of cavities (240) can be formed on substrate 250. At 1140, the portion(s) of the array of cavities can be placed on, attached to, etc. the array of piezoelectric transducers (207). In another embodiment (not shown), one or more cavities of the array of cavities can be filled with a material having a first acoustic velocity that is different from a second acoustic velocity of substrate 250. At 1150, substrate 1110 can be removed from the bottom electrodes.

Figure 12:
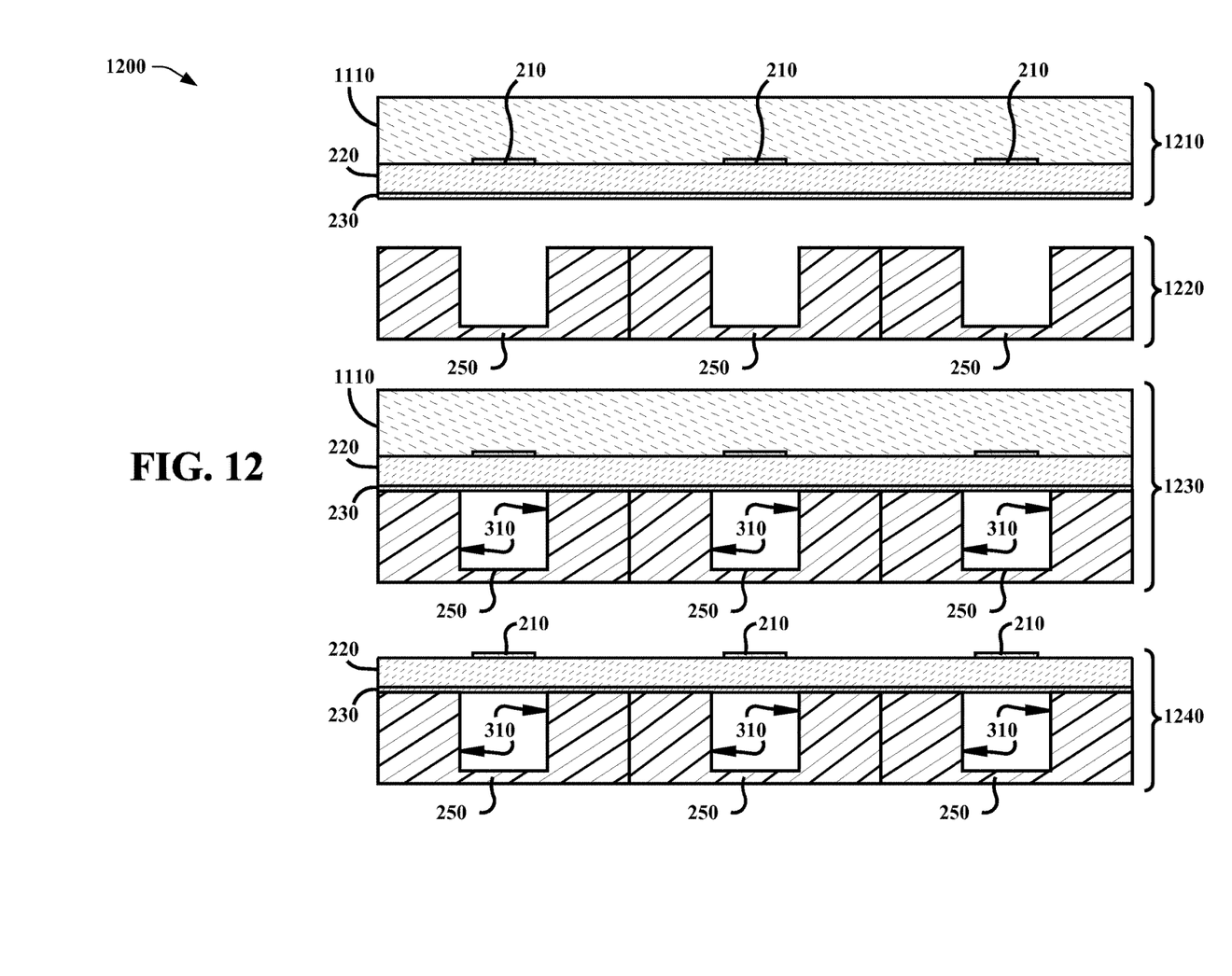
FIG. 12 illustrates a block diagram of a method for assembling another MEMS piezoelectric acoustic resonator, in accordance with various embodiments.

FIG. 12 illustrates a block diagram (1200) representing another method for manufacturing, assembling, etc. a MEMS piezoelectric acoustic resonator, e.g., MEMS piezoelectric acoustic resonator 605, is illustrated, in accordance with various embodiments. At 1210, an array of piezoelectric transducers (207) can be formed on substrate 1110. For example, top electrodes can be formed on substrate 1110; dielectric material 220 can be formed on, placed on, etc. the top electrodes and substrate 1110; and bottom electrodes (230) can be formed on, placed on, etc. dielectric material 220.

At 1220, portions(s) of an array of cavities (310) can be formed on substrate 250. At 1230, the portion(s) of the array of cavities can be placed on, attached to, etc. the array of piezoelectric transducers (207). At 1240, substrate 1110 can be removed from dielectric material 220 and the top electrodes.

The order in which some or all of the manufacturing, assembling, etc. steps described above with respect to block diagrams 1100 and 1200 should not be deemed limiting. Rather, it should be understood by a person of ordinary skill in MEMS technologies having the benefit of the instant disclosure that some of the steps can be executed in a variety of orders not illustrated.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A device, comprising:
an array of piezoelectric transducers; and
an array of cavities that has been attached to the array of piezoelectric transducers to form an array of resonators comprising a fingerprint sensor, wherein a first resonator of the array of resonators corresponds to a first frequency response representing the first resonator has been touched by a first ridge of a finger, and wherein a second resonator of the array of resonators corresponds to a second frequency response representing the second resonator has not been touched by a second ridge of the finger.

2. The device of claim 1, wherein the first resonator is an acoustic resonator.

3. The device of claim 2, wherein the first resonator is a Helmholtz resonator.

4. The device of claim 1, wherein the array of piezoelectric transducers comprises:
a piezoelectric material;
a first set of electrodes that has been formed a first side of the piezoelectric material; and
a second set of electrodes that has been formed on second side of the piezoelectric material, wherein a piezoelectric transducer of the array of piezoelectric transducers corresponding to the first resonator comprises a first electrode of the first set of electrodes and a second electrode of the second set of electrodes.

5. The device of claim 4, wherein a first end of a cavity of the array of cavities corresponding to the first resonator is smaller than a second end of the cavity.

6. The device of claim 5, wherein the first end of the cavity is open to an environment.

7. The device of claim 5, wherein the cavity has been filled with a first material corresponding to a first acoustic velocity that is different from a second acoustic velocity corresponding to a second material that is adjacent to the cavity.

8. The device of claim 5, wherein the first end of the cavity comprises a portion of the first resonator that has been touched.

9. The device of claim 4, wherein the piezoelectric transducer of the array of piezoelectric transducers corresponding to the first resonator comprises a portion of the first resonator that has been touched.

10. A system, comprising:
an array of piezoelectric transducers;
an array of cavities that has been attached to the array of piezoelectric transducers to form an array of resonators comprising a fingerprint sensor;
a memory to store instructions; and
a processor coupled to the memory, that facilitates execution of the instructions to perform operations, comprising:
determining a first frequency response of a first resonator of the array of resonators representing the first resonator has been touched by a first ridge of a finger, wherein the first resonator comprises a first piezoelectric transducer of the array of piezoelectric transducers and a first cavity of the array of cavities;
determining a second frequency response of a second resonator of the array of resonators representing the second resonator has not been touched by a second ridge of the finger, wherein the second resonator comprises a second piezoelectric transducer of the array of piezoelectric transducers and a second cavity of the array of cavities; and
based on the first frequency response and the second frequency response, deriving a fingerprint.

11. The system of claim 10, wherein the determining the first frequency response comprises determining a resonant frequency of the first resonator.

12. The system of claim 11, wherein the operations further comprise:
in response to determining that the resonant frequency has increased, determining that the first resonator has been touched by the first ridge of the finger.

13. The system of claim 10, wherein the determining the first frequency response comprises determining a quality factor of the first resonator.

14. The system of claim 13, wherein the operations further comprise:
in response to determining that the quality factor has decreased, determining that the first resonator has been touched by the first ridge of the finger.

15. The system of claim 10, wherein the array of piezoelectric transducers comprises:
a piezoelectric material;
a first array of electrodes that have been formed on a first side of the piezoelectric material; and
a second array of electrodes that have been formed on a second side of the piezoelectric material, wherein the first piezoelectric transducer comprises a first electrode of the first array of electrodes and a second electrode of the second array of electrodes.

16. The system of claim 10, wherein a first portion of the first cavity is smaller than a second portion of the first cavity.

17. The system of claim 16, wherein the first portion of the first cavity is open to an environment.

18. The system of claim 16, wherein the first cavity has been filled with a first material corresponding to a first acoustic velocity that is different from a second acoustic velocity corresponding to a second material that is adjacent to the first cavity.

19. The system of claim 16, wherein the first portion of the first cavity corresponds to a portion of the first resonator that has been touched.

20. The system of claim 10, wherein the determining the second frequency response comprises determining a resonant frequency of the second resonator, and wherein the operations further comprise:
   in response to determining that the resonant frequency has not changed, determining that the second resonator has not been touched by the second ridge of the finger.

21. A method, comprising:
   forming an array of piezoelectric transducers on a first substrate;
   forming one or more portions of an array of cavities using a second substrate;
   attaching the array of piezoelectric transducers to the second substrate to form an array of resonators of a fingerprint sensor, wherein a first resonator of the array of resonators is associated with a first frequency response corresponding to a determined touch of the first resonator by a first ridge of a finger, and wherein a second resonator of the array of resonators is associated with a second frequency response corresponding to a determined non-touch of the resonator by a second ridge of the finger; and
   removing the first substrate from the array of piezoelectric transducers.

22. The method of claim 21, wherein the forming of the array of piezoelectric transducers comprises:
   forming a first set of electrodes on a first side of a piezoelectric material; and
   forming a second set of electrodes on a second side of the piezoelectric material, wherein a piezoelectric transducer of the array of piezoelectric transducers corresponding to the first resonator comprises a first electrode of the first set of electrodes and a second electrode of the second set of electrodes.

23. The method of claim 21, wherein the first resonator comprises a Helmholtz resonator.

24. The method of claim 23, further comprising:
   filling a cavity of the array of cavities corresponding to the Helmholtz resonator with a material having a first acoustic velocity that is different from a second acoustic velocity of the second substrate.

25. The method of claim 21, further comprising:
   in response to determining that a first resonant frequency of the first resonator has increased, determining that the first resonator has been touched by the first ridge; and
   in response to determining that a second resonant frequency of the second resonator has not changed, determining that the second resonator has not been touched.

* * * * *